United States Patent [19]

Chung et al.

[11] Patent Number: 5,251,168

[45] Date of Patent: Oct. 5, 1993

[54] BOUNDARY CELLS FOR IMPROVING RETENTION TIME IN MEMORY DEVICES

[75] Inventors: Gishi Chung, Garland; William R. McKee, Plano; William F. Richardson, Richardson; Lionel S. White, Jr., Dallas, all of Tex.

[73] Assignee: Texas Instruments Incorporated, Dallas, Tex.

[21] Appl. No.: 738,383

[22] Filed: Jul. 31, 1991

[51] Int. Cl.⁵ .................................................. G11C 7/02
[52] U.S. Cl. ......................................... 365/51; 365/63; 365/230.03
[58] Field of Search .............. 365/51, 52, 63, 230.03; 357/23.6, 23.69, 41, 45, 59

[56] References Cited

U.S. PATENT DOCUMENTS

| | | | |
|---|---|---|---|
| 4,827,449 | 5/1989 | Inoue | 365/51 |
| 4,855,956 | 8/1989 | Urai | 365/51 |
| 4,967,396 | 10/1990 | Kajigaya et al. | 357/45 |
| 5,014,110 | 5/1991 | Satoh | 357/45 |
| 5,014,246 | 5/1991 | Komatsu et al. | 365/230.03 |
| 5,097,440 | 3/1992 | Konishi et al. | 357/45 |

Primary Examiner—Eugene R. LaRoche
Assistant Examiner—Vu Le
Attorney, Agent, or Firm—Robby T. Holland; Richard B. Havill; Richard L. Donaldson

[57] ABSTRACT

By placing boundary cells within areas of discontinuity of a memory array, such as in word line strap areas, stress on edge cells of the memory array is reduced; the reduction of stress improves leakage characteristics and pause-refresh capabilities of edge cells. The boundary cells may further be laid out in the areas of discontinuity with the same pattern as the memory array. Some of the boundary cells may be electrically biased to act as minority carrier sinks. By collecting minority carriers that otherwise may be attracted to edge cells of the memory array, the leakage characteristics of the edge cells and their pause-refresh capabilities are further enhanced. The boundary cells are particularly useful in improving leakage characteristics of dynamic random access memory devices of the trench capacitor type.

17 Claims, 7 Drawing Sheets

BOUNDARY CELLS FOR IMPROVING RETENTION TIME IN MEMORY DEVICES

FIELD OF THE INVENTION

This invention relates to integrated semiconductor devices and more particularly to dynamic memories.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for high density 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al, (a trench capacitor cell).

Manufacturers of dynamic memories are concerned with data retention time characteristics. A test referred to as "pause-refresh" measures the time retention of the memory. This test delays the normal refresh cycle time. Data bits initially stored in the memory cells are measured as the refresh cycle time is extended. The retention time of the memory device is thus given by the longest length of time the refresh cycle may be extended before the bits stored in memory begin to fail.

A difficulty in fabricating high density integrated devices such as dynamic memories is that memory cells around edges of the memory array, edge cells, typically have worse pause refresh characteristics than memory cells central to the memory array. Edge cells begin to lose data sooner than random center cells of a memory array. If the edge cells do not have sufficient pause refresh capabilities, then the memory device is suspect.

It is the principal object of this invention to provide a semiconductor memory device that is less susceptible to edge cell failures. Other objects and advantages of this invention will be apparent to those of ordinary skill in the art having reference to the following specification and drawings.

SUMMARY OF THE INVENTION

A memory array may have areas of discontinuity patterning in internal boundaries, such as word line strap areas, and areas of discontinuity patterning in external boundaries, such as between the memory cells and peripheral circuits. The invention reduces leakage traits of edge cells of the memory array that are located on ends of the array adjacent to these internal and external boundaries. Boundary cells are laid out into the internal and external boundaries. The boundary cells may have the same pattern as the array cells and may be formed at the same time the array cells are created. By laying out boundary cells into the areas of discontinuity, stress on the edge cells is relieved and leakage is reduced. Biasing the boundary cells at a voltage potential causes minority carriers that might otherwise be collected by the edge cells of memory array to be collected by the boundary cells. These boundary cells act as a minority carrier sink and further reduce leakage of the edge cells.

DETAILED DESCRIPTION OF THE PREFERRED EMBODIMENT

Figure 1:
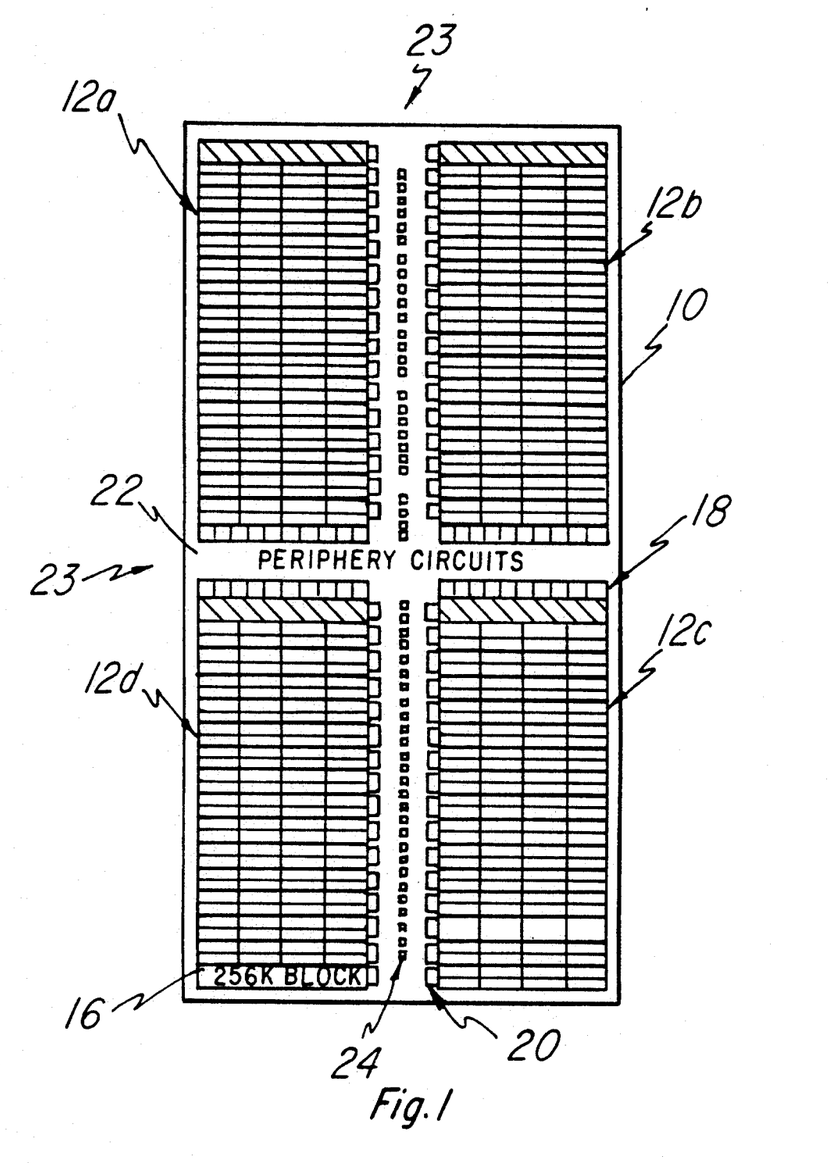
FIG. 1 is a block system level drawing illustrating a semiconductor integrated circuit device on a substrate incorporating the preferred embodiment of the invention.

Referring to FIG. 1, a semiconductor memory device is shown that may incorporate the preferred embodiment of the invention. The illustrative semiconductor memory device is a 16M DRAM dynamic random access memory having a memory array 12 formed in an active face of semiconductor silicon substrate 10. A submicron process such as disclosed in U.S. Pat. No. 5,017,506 issued May 5, 1991 and assigned to Texas Instruments Incorporated may produce such a memory device on a semiconductor chip size of about 327×660 mils.

With reference to the 16M dynamic memory illustrated in FIG. 1, generally, the memory array 12 is partitioned into four memory quadrants 12a-12d of 4 Megabits each. Each memory quadrant 12a-12d contains sixteen memory blocks 16 of 256 Kilobits each. Each memory block 16 contains 2048 folded bit lines 17, or 1024 columns, terminating in 1024 sense amplifiers, and has 256 word lines 19, or rows. (The bit lines, word lines, and sense amplifiers are not illustrated in FIG. 1 for clarity.) The column decoders 18 lie along the vertical axis 23 of the chip adjacent to their respective memory array quadrants. The row decoders 20 lie along the horizontal axis 25 of the chip adjacent to their respective memory array quadrants. The periphery circuits 22, containing such devices as the input and output buffers and the timing and control circuits, are formed in the periphery of the substrate and are centrally located along the vertical axis of the chip while the bond pads 24 are centrally located along the horizontal axis of the chip. Although not illustrated in FIG. 1 for clarity, the DRAM receives addresses signals A0-A11 and its operation is controlled by the standard signals Row Address Strobe RAS_, Column Address Strobe CAS_, and Write Enable W_.

Figure 2:
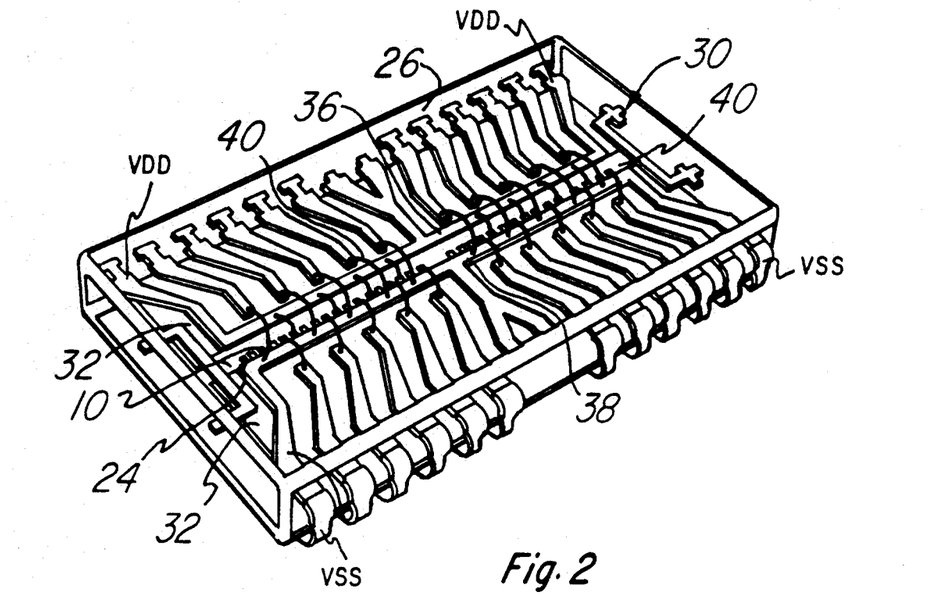
FIG. 2 is a three dimensional view of the packaged, encapsulated, semiconductor integrated circuit device wherein the encapsulant is rendered transparent.
Figure 3:
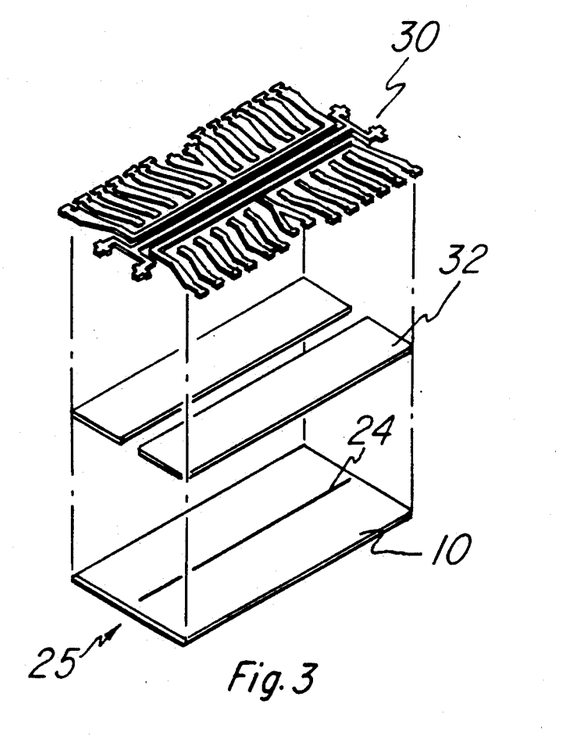
FIG. 3 is a partial assembly view of FIG. 2.

FIG. 2 depicts a three dimensional view of the encapsulated chip 10 wherein the encapsulant 26 is rendered transparent while FIG. 3 presents an assembly view. The chip 10 is encapsulated in a thin plastic small outline J-type package of the lead over chip center bond (LOCCB) type. The chip 10 underlies the lead frame 30.

Two strips of polyimide tape 32 attach the chip 10 to the lead frame 30. The two strips of tape 32 are positioned along the horizontal axis 25 of chip 10 on opposite sides of the bond pads 24 leaving the bond pads uncovered and exposed. When assembled, the bond pads 24 lie between the Vdd power supply bus 36 and the Vss power supply bus 38 of the lead frame 30. Various wire bonds 40 attach the Vdd power supply bus 36 and the Vss power supply bus 38 to various of the bond pads 24 allowing multiple connections from the power supply busses to the semiconductor chip 10. Other wire bonds, such as wire bond 40a, cross over the power supply busses and attach the lead fingers 40 to the bond pads 24. These crossing wire bonds do not touch the power supply busses and no shorting occurs.

Figure 4:
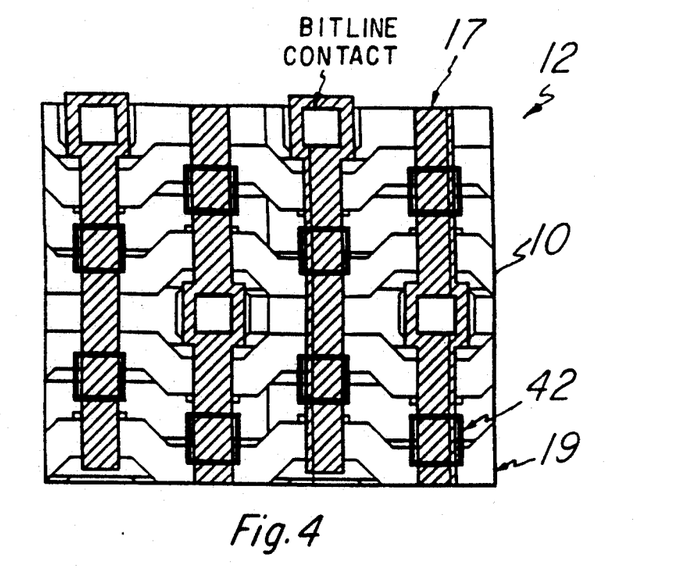
FIG. 4 is a top view of a portion of the memory array layout of the semiconductor integrated circuit device.

FIG. 4 is a top view of a portion of memory array 12. The memory cells are of the trench capacitor type and are laid out in a double word line pitch. The bit lines 17 may be triple twisted for improving noise immunity. The word lines 19 are polysilicon and are strapped every 64 bits. Strapping the word lines reduces word line resistance. However, strapping the word lines also creates areas of discontinuity within the memory array as is later explained.

Figure 5:
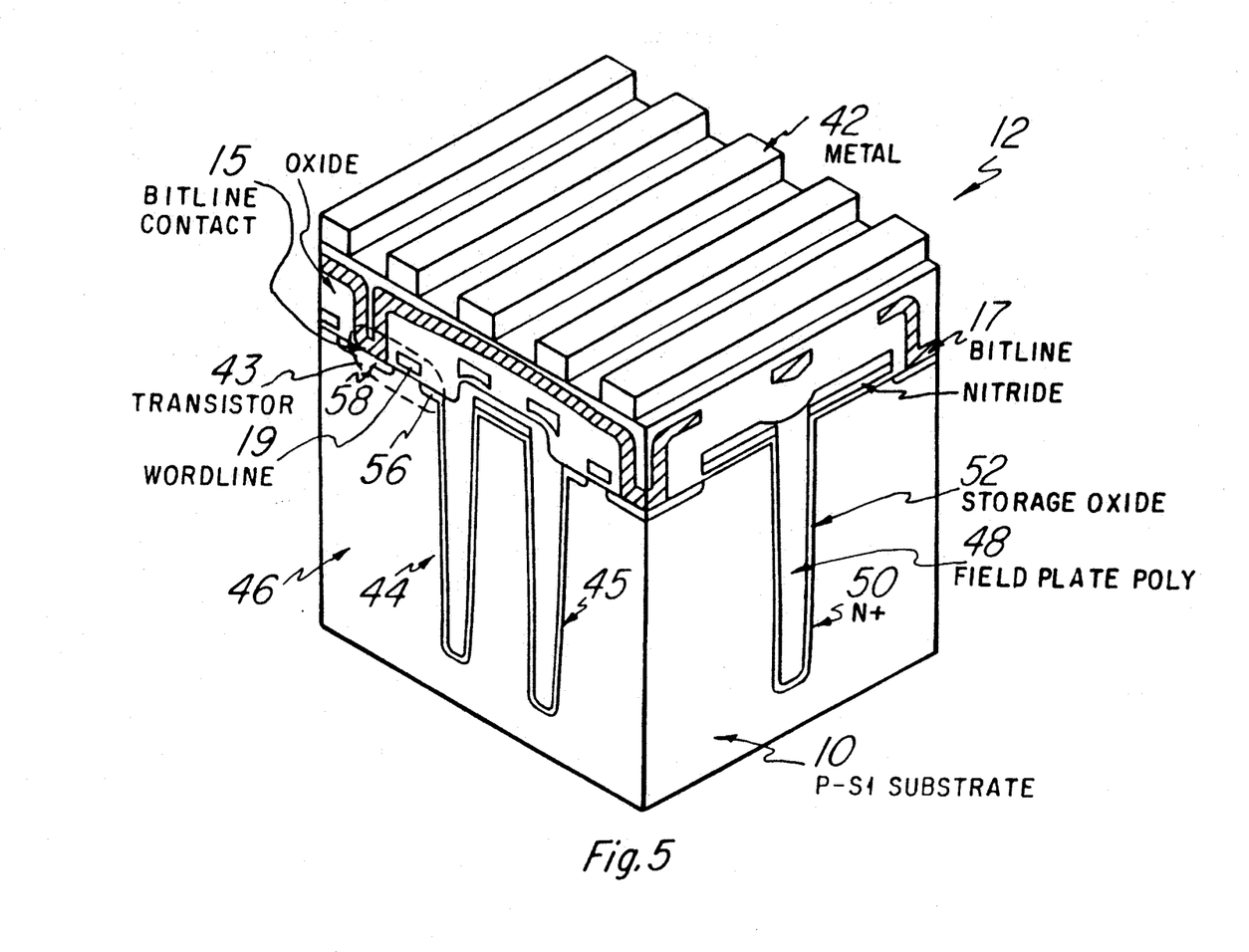
FIG. 5 is a cross sectional view of the memory cells of the memory array.
Figure 6:
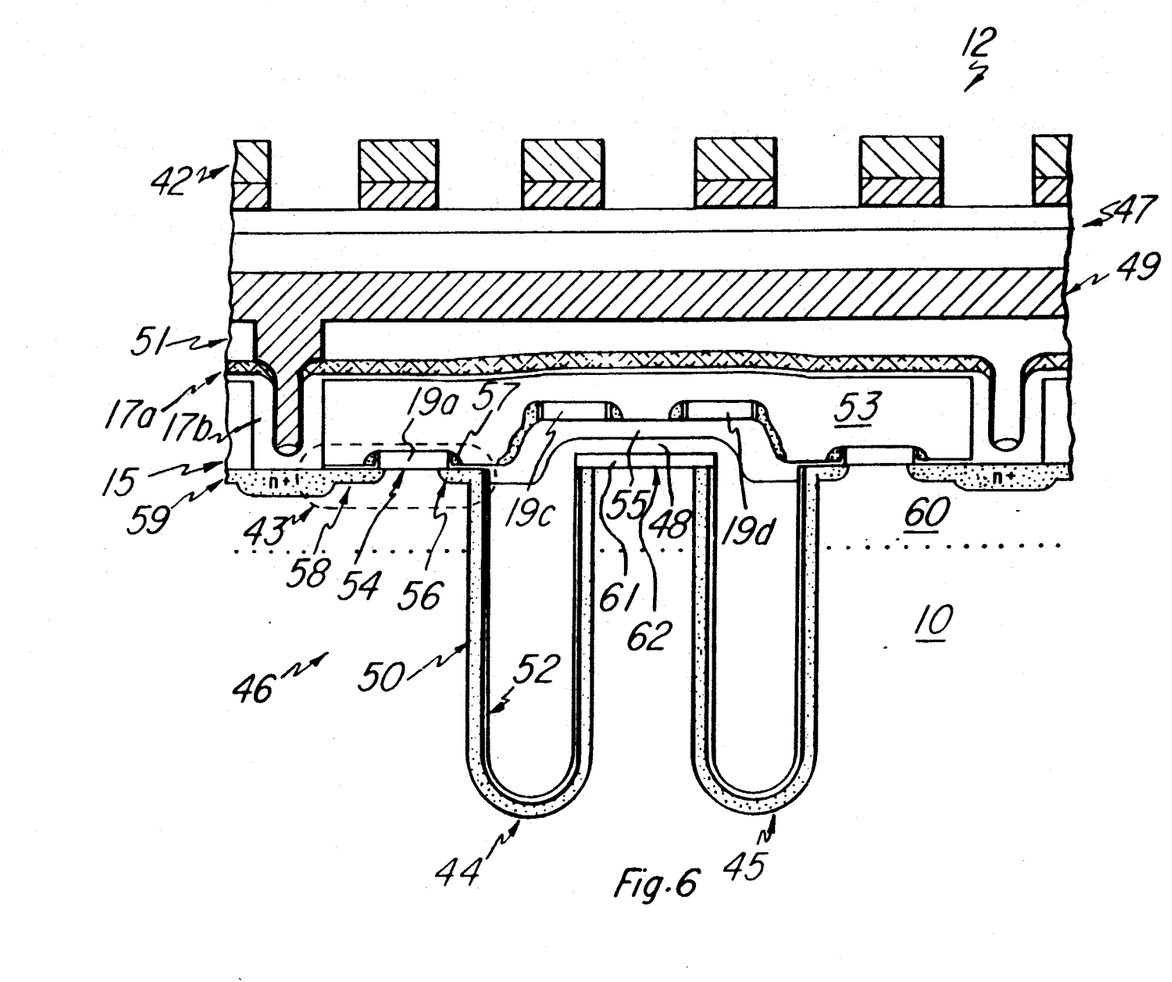
FIG. 6 is a side view of the memory cells.

FIG. 5 presents a three dimensional view of a portion of the memory array 12 while FIG. 6 presents a cross section view. An interconnect metal layer 42 accomplishes word line strapping. It is a second level of metal and may accordingly be referred to as metal-2. An oxide layer 47 separates metal layer 42 from a metal layer 49. Metal layer 49 is a multi level interconnect metal that accomplishes contacts to the bit lines. It is a first level of metal and may accordingly be referred to as metal-1. An oxide layer 51 lies below interconnect metal 49 to provide isolation between the silicided bitlines 17 and metal layer 49. The bit lines 17 comprise a layer of titanium silicide 17a overlying a layer of polysilicon 17b. They have a pitch of about 1.6 microns. An oxide layer 53 lies beneath the bit lines 17 and lies over the submicron word lines 19. The word lines 19 have width of about 0.6 microns. Word line 19a forms the gate of pass transistor 43. It is separated from the substrate 10 by an oxide layer 54. Word lines 19c and 19d pass over the top trench capacitors 44 and 45 and connect to other trench capacitors not shown. They are separated from the polysilicon field plate 48 by an oxide layer 55. The word lines 19 have side walls 57 of nitride. An N+ diffusion 59 lies in the P-tank 60 underneath the bit line contacts 15 and between word line 19a and trench capacitor 44. The N+ diffusion 59 thus forms the source 56 and the drain 58 of the pass gate transistor 43. Underneath field plate 48, between the trench to trench space separating trench capacitors 44 and 45, lies a nitride layer 61. Between nitride layer 61 and P-tank 60 lies an oxide layer 62. It acts as a buffer layer between the silicon substrate 10 and the nitride layer 61 and is part of the field plate isolating dielectric. The trench capacitors 44 and 45 extend through openings in the field plate 48, through the P-tank 60, and into the P substrate of the silicon wafer 10 about 6 microns. A layer 50 of implanted arsenic outside the trench capacitor walls creates the N+ storage node of the capacitors. The trench capacitor walls contain a layer 52 of oxide and nitride that acts as a dielectric layer between the arsenic trench wall implant and the polysilicon field plate 48. Transfer transistor 43 and trench capacitor 44 comprise memory cell 46.

Figure 7:
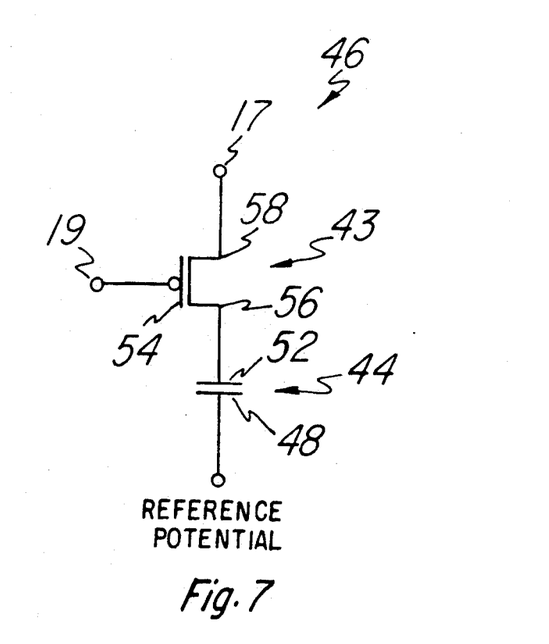
FIG. 7 is an electrical schematic diagram of a memory cell.

FIG. 7 is an electrical schematic diagram showing the electrical operation of transfer transistor 43 and trench capacitor 44. When data is to be stored on memory cell 46, the data, 3.3 v or 0.0 v, is placed on bit line 17 and a high voltage signal (approximately 6 volts) is placed on gate 54. The voltage placed on bit line 17 is passed via source 56 to storage dielectric 52. Field plate 48 is tied to a reference potential of about 1.65 volts and thus a charge representing the voltage applied by bit line 17 is stored on storage dielectric 52. To store the data on storage dielectric 52, the positive voltage is removed from gate 54 thus stopping continuity between source 56 and drain 58.

Figure 8:
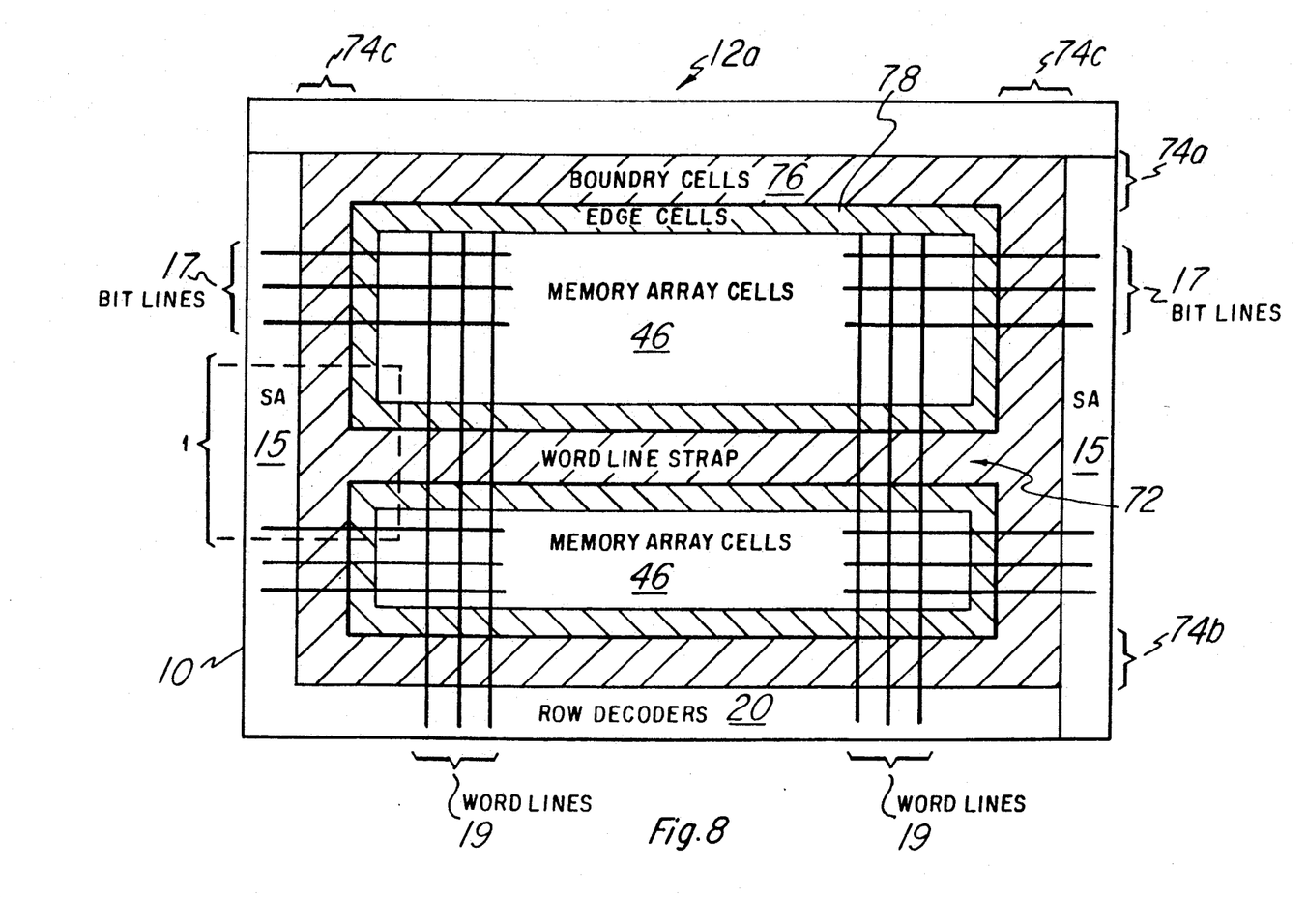
FIG. 8 is a block diagram of a portion of a memory array illustrating the boundary cells of the invention.

FIG. 8 is a block diagram illustrating a portion of array 12a and depicts locations of inventive boundary, cells 76. (As will be later explained, the boundary cells 76 provide stress relief and minority carrier protection for the memory array edge cells 78. This reduces the leakage characteristics and improves the pause refresh characteristics of the memory array edge cells 78.) FIG. 8 is not to scale. The memory arrays have internal boundary areas 72 and external boundary areas 74. Internal boundaries 72 are located inside the memory arrays while external boundaries 74 are located outside the memory arrays. An example of an internal boundary 72 is the space between the memory array cells for the word line straps. Another example of an internal boundary, not illustrated in FIG. 8, is an area for the bit line twist. Examples of external boundaries 74 include the space between memory array cells 46 and the outer edge of semiconductor chip 10, the space between the memory array cells 46 and the row decoders 20, and the space between the memory array cells 46 and the sense amplifiers 15. The edge cells 78 are memory array cells lying near the edges of the memory arrays next to the internal and external boundaries. The cross-hatches \ \ \ connote locations of edge cells 78. The boundary cells 76 may be located in both the internal boundaries 72 and the external boundaries 74 next to the edge cells 78. In FIG. 8, they are interposed between the edge cells 78 and the sense amplifiers 15 in external boundary 74c, between the edge cells 78 and the end of semiconductor chip in external boundary 74a, and between the edge cells 78 and the row decoders 20 in external boundary 74b. The boundary cells are also interposed between the edge cells 78 in the internal boundary word line strap area 72b. Memory array cells 46, other than those which are edge memory cells, are referred to as random center cells even though they are very ordered. The bit lines 17 connect the memory array cells 46 and edge cells to the sense amplifiers 15. They cross over internal boundary 74c and the boundary cells 76 lying therein. The word lines 19 connect the memory array cells 46 to the row decoders 20. They cross over external boundary 74b, internal boundary 72b and into external boundary 74a.

Figure 9:
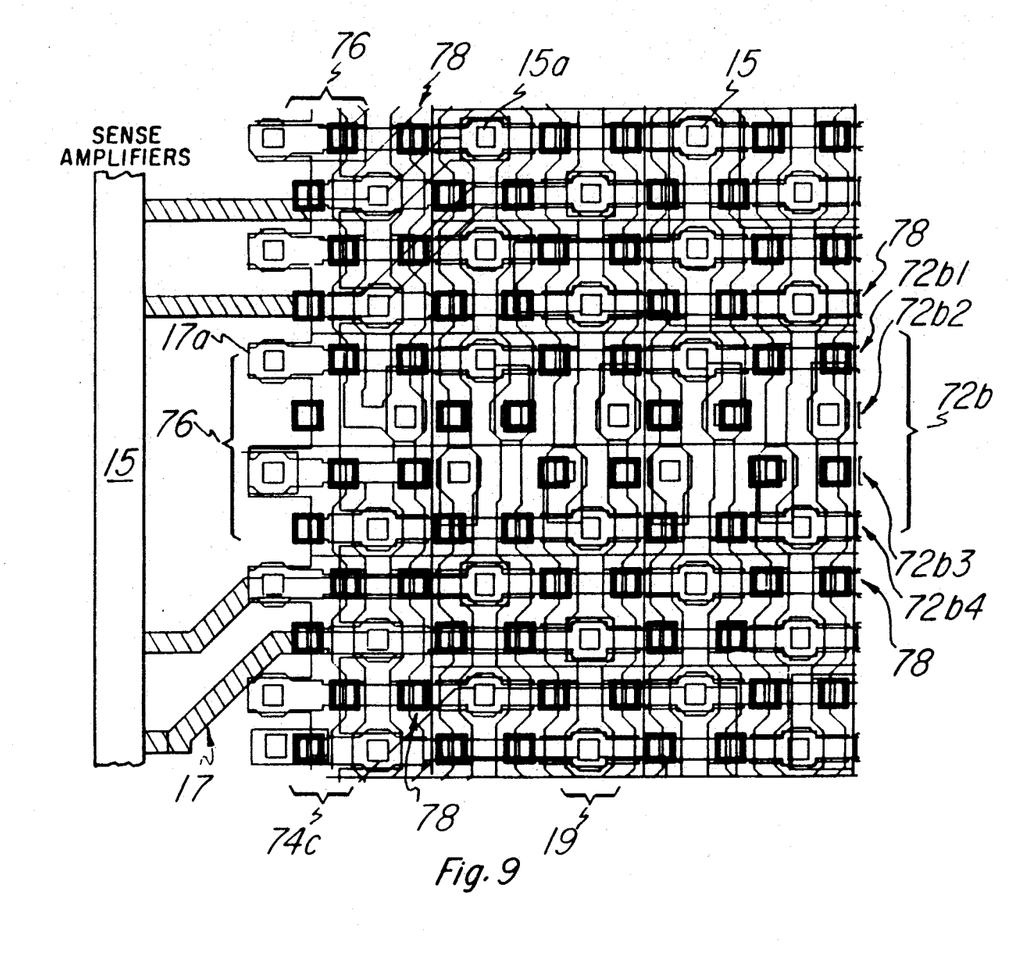
FIG. 9 is a top view of a portion of a memory array illustrating a layout of the boundary cells.

FIG. 9 is a top view of a memory array layout, similar to FIG. 4, illustrating the layout of the boundary cells 76, the edge cells 78, and the array memory cells 46. The layout is representative of the arrangement of these cells within the area between the lines 1—1 of FIG. 8. The word line strap area 72 is preferably an even multiple of the bit line pitch, due to the folded nature of the bit lines, and in FIG. 8, word line strap area 72 comprises 4 bit line pitches 72b1–72b4. The word line strap area 72 creates an area of discontinuity within the array. The discontinuity creates stress on the edge cells 78. However, since the edge cells 78 are surrounded by boundary cells 76, stress on the edge cells is reduced. Reducing stress on the memory array edge cells reduces leakage characteristics of these cells and improves their pause-refresh capabilities. The boundary cells may be formed by the same process as the memory cells and at the same time the memory cells are created.

In FIG. 9, the boundary cells 76 are laid out into the memory array areas of discontinuity to fill the discontinuity areas and thus form a ring of boundary cells around each contiguous block of memory in a memory array. The boundary cells may be laid out in the same pattern as the memory array cells to further reduce stress on memory array edge cells. FIG. 8 shows the boundary cells having the same pattern as the array cells.

In FIG. 9, the boundary cells within pitches 72b1 and 72b4 are adjacent to edge cells 78. Boundary cells within pitches 72b1 and 72b4 are preferably full structure cells, configured the same as the memory array cells 46 with field plate openings over them. The boundary cells within pitches 72b2 and 72b3 are not full structure cells; they have trenches but do not have field plate openings over the trenches. To make the word line strap contacts, a relatively flat spot within the word line strap area is needed. A pad of gate polysilicon is made in the relatively flat area. A metal-1 contact to the gate poly pad is made. A metal-2 contact is made to metal-1. Field plate openings interfere with making the word line strap contacts. The trenches of the boundary cells within pitches 72b2 and 72b3 are filled the polysilicon field plate 48 and are planarized to create the relatively flat spot for the word line strap contact.

Still referring to FIG. 9, the boundary cells 76 within the word line strap pitches 72b1 and 72b4 and the boundary cells 76 lying within boundary 74c between the sense amplifiers 15 and the edge cells 78 are connected with a boundary bit line 17a. The boundary bit line 17a is connected to a reference potential, such as voltage reference bit line potential VBLR. VBLR in this example has a value of about 1.65 volts. The word lines 19 turn on and off in response to the row decoders 20 activating a row. When a word line 19 that is connected to a boundary cell 76 within word line strap pitches 72b1 and 72b4, the transistor gate for that boundary cell turns on and allows the potential to fully charge the cell to VBLR. Then the word line is turned off. Since the memory array is refreshed, these boundary cells are refreshed with VBLR. During the pause interval, the voltage placed on these boundary cells decreases slightly, but then gets charged back up on the next refresh cycle. Because these boundary cells are electrically biased, they act as a minority carrier sink. Electrons floating around in the memory array are captured by these cells and they are drained away to the positive power supply. Preventing minority carrier interference reduces the leakage characteristics of the edge cells 78 and improves their pause-refresh capabilities. As described above in this paragraph, the boundary cells in area 74c and the boundary cells in word line strap areas 72b1 and 72b4 are not hard-tied to a voltage potential. Other boundary cells may be hard tied to a voltage potential, such as those in boundary area 74a and 74b of FIG. 8.

The effects of minority carrier injection, stress, and the inventive boundary cells according to the preferred embodiment of the invention are now more fully described. Minority carrier injection, large differences in adjacent depletion volume and stress contribute to early edge bit failures. Minority carrier electrons may be generated or injected into the substrate from a variety of sources. They are constantly being generated in the depletion volume and at crystal defects and surfaces. The firing of sense amplifiers and the switching of clock circuits may inject electrons. These minority carriers propagate through the semiconductor substrate and can be collected by the memory cells. In the absence of other competing junctions, the probability of being collected is proportional to the distance of the memory cell junction from the generation or injection source and the number of minority carriers available is proportional to the total depletion volume and the density of the injecting circuitry. The edge cells, because of their location next to the sense amplifiers and periphery circuits receive more unwanted minority carriers than random center cells of the memory array. The minority carriers disturb the data stored within these cells and cause them to have generally poorer pause refresh capabilities than random center cells of the memory array.

In a trench type capacitor memory cell, a large difference in the effective adjacent depletion volume between edge cells and random center cells causes a difference in the injection effect from the depletion layer around the trench diode junction area. Because the trenches extend deep into the substrate, they are much more effective at collecting the injected carriers than a planar junction and almost no such electrons get past the first row of collecting trenches. Between trenches within the array, there is no injecting circuitry. The depletion volume is much smaller and is shared between the adjacent cells so the repetitiveness of the array contributes to the uniformity of the center cells. By virtue of their location, edge cells collect from adjacent circuitry and from a much larger depletion volume than the center cells. Data can leak away due to the current that is comprised of the collection of these electrons on the diode formed by the n+ trench outside layer and the p− well. However, electrically biasing the boundary cells causes them to act as a minority carrier sink and collect in the substrate and drain them away. This reduces minority carrier interference and subsequently reduces leakage characteristics of the edge cells and improves their pause-refresh capabilities.

Stress in the edge cells results from discontinuity patterning in the memory array. Diffused trench wall capacitors are more susceptible to stress induced leakage than planar junctions because the junction is normal to the forces generated by material differences producing a shear stress on the junction. There is less mechanical stress on a memory cell that is surrounded by other memory cells than there is on a memory cell at the edge of the array. The memory cells adjacent to the sense amplifiers, word line straps or periphery experience more mechanical stress than those memory cells surrounded by other memory cells. Array repetitiveness imparts uniformity to the random center cells. The shear stress causes leakage according to its severity and the data stored in the edge cells leaks away at a higher rate so that edge bit failure occurs. However, since the edge cells are adjacent to boundary cells, stress on the edge cells is reduced. Laying out the boundary cells into the areas of discontinuity with the same pattern relieves stress on memory array edge cells. The effect of surrounding the memory array edge cells with a ring of continuous boundary cells is to extend the memory array so that stress is imparted onto the boundary cells rather than the edge cells. If the boundary cells are laid out in substantially the same pattern as the memory array cells, the stress is further reduced. Decreasing stress on the memory array edge cells reduces leakage characteristics of these cells and improves their pause-refresh capabilities.

The invention thus has application in a memory array that has internal and external boundaries. Boundary cells are laid out into the internal and external boundaries and may form a continuous ring around each contiguous block of memory array. The boundary cells reduce stress on the cells of the memory array next to them. By arranging the boundary cells in the same pattern as the memory array, stress of the memory array cells is further reduced. Some of the boundary cells may be biased at a voltage potential. Electrically biasing the boundary cells causes them to attract minority carriers that might otherwise be attracted to the cells of memory array. This further increases the effectiveness of the boundary cells.

While the invention has been described in use with a dynamic random access memory device of the trench capacitor type, it is not limited to this type of device. The invention has broad applicability in memory devices. Other nonlimiting examples of memory devices benefitting from the invention include stacked capacitor type memory devices and planar type memory devices. Areas of pattern discontinuity are not limited to word line strap areas and include other discontinuities such as bit line twist regions for example. The voltage that biases the outer boundary cells may be higher or lower than about 1.65 volts and, for example, could be 3.3 volts in a 3.3 volt memory device or smaller for memory devices in low power applications such as lap-top computers.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A memory device formed on a semiconductor substrate, comprising:
   an array of memory cells laid out on the semiconductor substrate in a pattern, having edge memory cells separated from each other by a boundary internal to the array; and
   boundary cells laid out in the internal boundary, some of the boundary cells laid out in the internal boundary are electrically biased.

2. The memory device of claim 1 wherein the array of memory cells additionally has edge memory cells next to a boundary on the semiconductor substrate external to the memory array, and further comprising:
   boundary cells laid out in the external boundary in the same pattern as the array of memory cells.

3. The memory device of claim 2 wherein some of the boundary cells laid out in the external boundary are electrically biased.

4. The memory cell of claim 1 wherein the boundary cells that are laid out in the internal boundary have approximately the same pattern as the array of memory cells.

5. A semiconductor memory device, comprising:
   an array of memory cells formed in a face of a semiconductor body in a pattern at the intersection of word lines and bit lines;
   an area of discontinuity on the semiconductor substrate within the array of memory cells that breaks the pattern; and
   boundary cells formed in the face of the semiconductor body in the area of discontinuity, wherein some of the boundary cells are electrically biased.

6. The semiconductor memory device of claim 5 wherein the area of discontinuity is a word line strap area.

7. The semiconductor memory device of claim 5 wherein the area of discontinuity is a bit line twist area.

8. The semiconductor memory device of claim 5 wherein the boundary cells have about the same pattern as the array of memory cells.

9. The semiconductor memory device of claim 5 further comprising:
   another area of discontinuity that is external and adjacent to the memory array; and
   boundary cells formed in the face of the semiconductor body in the area of discontinuity that is external and adjacent to the memory array and formed in the same pattern as the array of memory cells.

10. A memory device, comprising:
    an array of memory storage cells that are laid out in a pattern in a face of semiconductor material and that are connected to word lines of a word line pitch and bit lines of a bit line pitch;
    a word line strap area in the array of memory storage cells to connect the word lines to a conductor in order to reduce resistance in the word lines;
    boundary cells laid out in the face of semiconductor material, in the word line strap area to reduce stress on memory storage cells next to the word line strap area;
    sense amplifiers connected to the memory storage cells by bit lines; and
    boundary cells laid out in the face of the semiconductor material between the sense amplifiers and the array of memory storage cells to reduce stress on memory storage cells next to the sense amplifiers, wherein some of the boundary cells that are laid out in the face of the semiconductor material between the sense amplifiers and the array of memory storage cells are electrically biased to collect minority carriers that may travel in the face of the semiconductor material.

11. The memory device of claim 10 wherein the boundary cells are laid out in the face of the semiconductor material in about the same pattern as the array of memory storage cells.

12. The memory device of claim 10 wherein the word line strap area is a multiplicity of the bit line pitch.

13. The memory device of claim 10 wherein some of the boundary cells that are laid out in the face of the semiconductor material in the word line strap area are electrically biased to collect minority carriers that may travel in the face of the semiconductor material.

14. The memory device of claim 13 wherein the word line strap area has three regions:
    a first region located next to one edge of the array memory storage cells;
    a second region located next to another edge of the array memory storage cells; and
    a third region located between the first part and the second part; and wherein the boundary cells that are laid out in the face of the semiconductor material in the word line strap area that are electrically biased to collect minority carriers are located in the first region and the second region of the word line strap area.

15. The memory device of claim 14 wherein the memory storage cells are dynamic memory storage cells of the trench capacitor type and the boundary cells are trench cells.

16. A method of improving leakage characteristics of edge cells of a dynamic memory device comprising the steps of:

forming a memory array in a pattern, the memory array having edge cells along edge areas of discontinuity within and without the memory array pattern;

forming boundary cells next to the edge cells in the areas of discontinuity to relieve stress on the edge cells, the reduction of stress on the edge cells improving their leakage characteristics; and coupling some of the boundary cells in the areas of discontinuity to a voltage potential to bias them so that they prevent minority carriers from collecting on the edge cells to improve the leakage characteristics of the edge cells.

17. The method of claim 16 wherein the step of forming boundary cells next to the edge cells in the areas of discontinuity also includes forming the boundary cells in substantially the same pattern as the memory array pattern.

* * * * *